United States Patent

Anand

[11] Patent Number: 6,037,247
[45] Date of Patent: Mar. 14, 2000

[54] METHOD OF MANUFACTURING SEMICONDUCTOR DEVICE HAVING A SELF ALIGNED CONTACT

[75] Inventor: Minakshisundaran Balasubramanian Anand, Yokohama, Japan

[73] Assignee: Kabushiki Kaisha Toshiba, Kawasaki, Japan

[21] Appl. No.: 09/020,407

[22] Filed: Feb. 9, 1998

[30] Foreign Application Priority Data

Feb. 10, 1997 [JP] Japan .................................... 9-026525

[51] Int. Cl.$^7$ ................................................. H01L 21/4763
[52] U.S. Cl. ......................... 438/618; 438/649; 438/682; 438/279
[58] Field of Search .................................... 438/299–307, 438/286, 618, 620–686, 279

[56] References Cited

U.S. PATENT DOCUMENTS 5,547,888  8/1996  Yamazaki .
5,874,343  2/1999  Fulford, Jr. et al. .

Primary Examiner—Jey Tsai
Attorney, Agent, or Firm—Finnegan, Henderson, Farabow, Garrett & Dunner, L.L.P.

[57] ABSTRACT

The present invention provides a way how to use a technique for forming the contact of a diffusion layer in a self-alignment manner in combination with a salicide technique. The most important finding in the way is that when an insulating film is deposited over the entire surface, the insulating film deposited on a shared diffusion layer which is present in a depressed portion between two electrodes is thinner in a natural course of events than that deposited on open-surfaces of the two electrodes. When such an insulating film different in thickness is etched, the relatively thin insulating film formed on the shared diffusion layer is substantially completely removed, whereas the relatively thick insulating film formed on the two electrodes is not completely removed and remains as a thin film. Hence, if the silicide layer is formed on the diffusion layer and the electrodes before the insulating film is deposited, the insulating film formed on the shared diffusion layer is selectively removed while leaving the insulating film formed on the electrodes.

12 Claims, 5 Drawing Sheets

METHOD OF MANUFACTURING SEMICONDUCTOR DEVICE HAVING A SELF ALIGNED CONTACT

BACKGROUND OF THE INVENTION

The present invention relates to a semiconductor device having a narrow contact formed in an interval between electrodes in a self-alignment manner, and also relates to a method of manufacturing the semiconductor device.

Recently, the integration level in LSI has been increased more and more. The increase in the integration level is particularly significant in DRAMs, SRAMs, Flush EEPROMs, and gate arrays.

As shown in FIG. 1, to compensate a positional deviation of a contact hole 32 from a metal wiring 31, an alignment clearance has been required. However, the improvement of the integration level is prevented by the presence of the alignment clearance d1. Then, a technology has been developed to form the contact without the alignment clearance d1, as shown in FIG. 1B.

FIG. 2A shows an alignment clearance d12 formed between a contact hole 33 for a diffusion layer and a gate electrode 34. Whereas, FIG. 2B shows a contact hole 33 formed by a self-alignment technique. From these, it is clear that when the contact hole is formed by the self-alignment technique, the interval between adjacent gate electrodes 34 can be minimized.

The self-alignment technique must involve an idea for keeping an insulation state between the gate electrode and the contact electrode even if the contact hole is overlapped with the gate electrode.

FIG. 3 shows the technical idea. To explain the idea more specifically, the gate electrode 34 is covered with silicon nitride films 36 and 37. An interlayer insulating film (oxide film) 36 is deposited on the silicon nitride films. The interlayer insulating film 35 is etched to form a contact hole. Since an etching selective ratio of the oxide film 35 to the silicon nitride films 36 and 37 is large, the silicon nitride films 36 and 37 covering the gate electrode 34 remain without being etched, even if the etching position on the interlayer insulating film 35 is slightly shifted toward the gate electrode 34. It is therefore possible to maintain the insulating state between the gate electrode 34 and the contact electrode of a diffusion layer 38. Note that the silicon nitride film 36 formed on side walls of the gate electrode 34 is referred to also as "spacer layer", and the silicon nitride film 37 formed over the gate electrode 34 is referred to also as "cap layer". Such silicon nitride films may be one of the most important factors to form the contact hole 33 in a self alignment manner.

On the other hand, to accelerate an operation speed of LSI, it has been required to reduce the sheet resistance of the gate electrode and source/drain regions. This requirement can be satisfied by the newly developed technique called salicide technique. As known well, "salicide" is an abbreviation of "Self-Aligned Silicide". The "silicide" used herein is a compound of a semiconductor and a metal.

As shown in FIG. 4, a silicide layer 39 is formed on the surface portions of the gate electrode 34 and the source/drain region 38. The silicide layer 39 is formed by depositing a metal with a high melting point on the gate electrode 34 (polysilicon) and the source/drain region 38 (silicon), followed by heating.

It has been desired to employ the salicide technique together with the self-alignment technique for the contact hole, since the combination of the techniques will overcome two big problems associated with LSI, namely, "high-speed operation" and "integration", simultaneously. However, this idea has not yet been realized. This is because the gate electrode 34 is patterned after the silicon nitride film is deposited on the surface of a polysilicon wafer. To be more specific, since the surface of the gate electrode 34 patterned is covered with a silicon nitride film (cap layer) 37, the metal having a high melting point cannot be deposited on the surface of the polysilicon gate electrode 34.

If the gate electrode is patterned after the silicide layer is formed on the surface layer portion of the polysilicon wafer and the silicon nitride film is formed on the silicide layer, the aforementioned two techniques may be used together. However, to realize it, a cost increase is inevitable and a masking step must be added.

BRIEF SUMMARY OF THE INVENTION

An object of the present invention is to provide a semiconductor device formed by using the salicide technique in combination with the self-aligning contact technique without increasing steps and the manufacturing cost. The present invention is also directed to provide a method of manufacturing the semiconductor device.

The present invention provides a way how to use a technique for forming the contact of a diffusion layer in a self-alignment manner in combination with a salicide technique for forming a silicide layer on surfaces of an electrode and a diffusion layer. The most important finding in the way is that when an insulating film is deposited over the entire surface, the insulating film deposited on a common diffusion layer (explained later) which is present in a depressed portion between two electrodes is thinner in a natural course of events than that deposited on open-surfaces of the two electrodes. When such an insulating film different in thickness is etched, the following phenomenon will occur as a natural result. The phenomenon is that the relatively thin insulating film formed on the common diffusion layer is substantially completely removed, whereas the relatively thick insulating film formed on the two electrodes is not completely removed and remains as a thin film. Hence, if the silicide layer is formed on the diffusion layer and the electrodes before the insulating film is deposited, the insulating film formed on the common diffusion layer is selectively removed while leaving the insulating film formed on the electrodes. Since the insulating film is successfully left on the electrode, an insulation state between the conducting member and the electrode can be maintained even not only though the position of the common diffusion layer is slightly shifted from that of the contact hole but also through a conducting member is buried in a contact hole to form a contact for the common diffusion layer.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrated presently preferred embodiments of the invention, and together with the general description given above and the detailed description of the preferred embodiments given below, serve to explain the principles of the invention.

DETAILED DESCRIPTION OF THE INVENTION

Figure 1A:
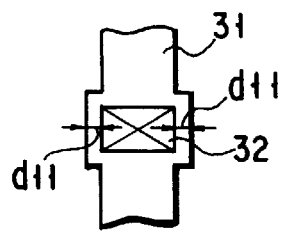
FIG. 1A is a plan view of a conventionally-formed contact hole for metal wiring.
Figure 1B:
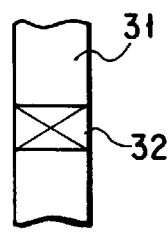
FIG. 1B is a plan view of a conventionally-formed contact hole for metal wiring formed by a self-aligning technique.
Figure 2A:
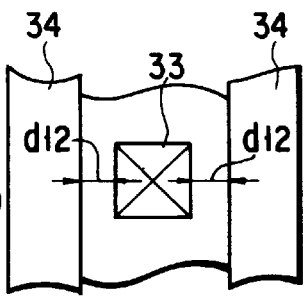
FIG. 2A is a plan view of a conventionally-formed contact hole for a diffusion layer between gate electrodes.
Figure 2B:
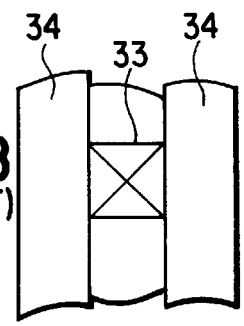
FIG. 2B is a plan view of a conventionally-formed contact hole for a diffusion layer between gate electrodes, formed by a self-alignment technique.
Figure 3:
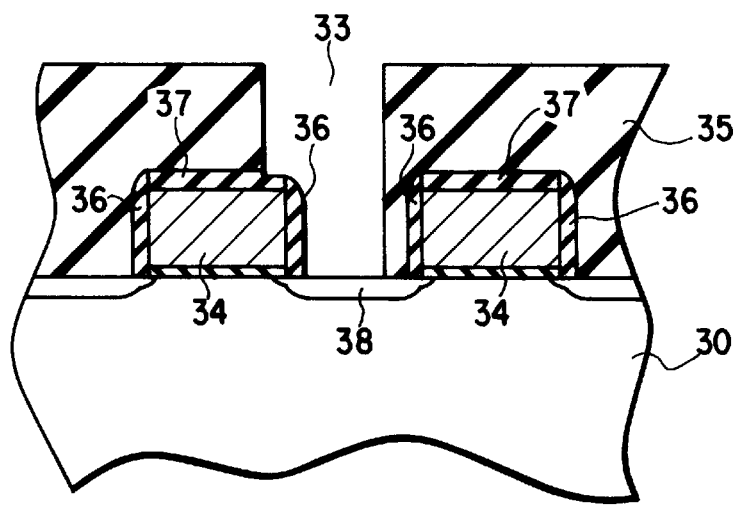
FIG. 3 is a cross sectional view of a conventionally-formed contact hole for a diffusion layer between gate electrodes formed by a self-alignment technique.
Figure 4:
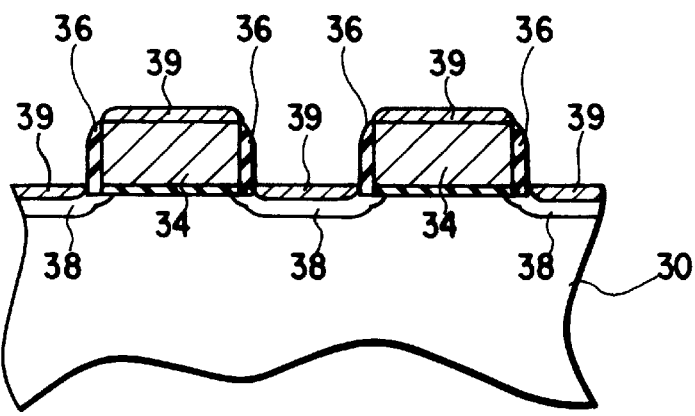
FIG. 4 is a cross sectional view of a conventionally-formed gate electrode and diffusion layer having a silicide layer on the surfaces thereof.
Figure 5:
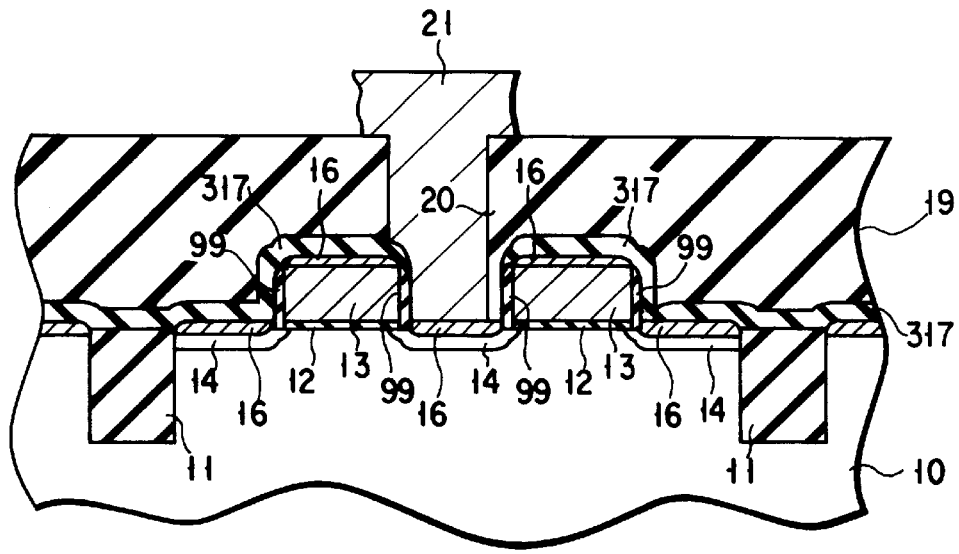
FIG. 5 is a cross sectional view of a semi-conductor device formed by use of the salicide technique in combination with the self-alignment contact technique, according to a preferable embodiment of the present invention.

FIG. 5 shows a sectional structure of a gist portion of a semiconductor device manufactured by the combination of the salicide technique with the self-alignment contact technique according to a preferable embodiment of the present invention. As the semi-conductor device, a transistor device will be explained. A device isolation region 11 in the silicon substrate 10 is formed by a trench device isolation method or a selective oxidation method. Two gate electrodes 13 are formed on the silicon substrate 10 with a gate insulating film 12 interposed between them. The two gate electrodes 13 are positioned at a relatively narrow interval (e.g., 0.25 μm or less), defined by parameters except an alignment clearance.

Relative to the two gate electrodes 13, three diffusion layers 14 serving as the source/drain are formed. The diffusion layer 14 between the two gate electrodes 13 is commonly shared with the two electrodes 13.

A silicide layer 16 is formed on each of surface layers of the gate electrodes 13 and the diffusion layers 14. On the side walls of the gate electrode 13, a spacer layer 99 is formed of, for example, a silicon nitride film. The portions except the commonly shared diffusion layer 14 (hereinafter, referred to as "common diffusion layer") are covered with a silicon nitride film 317. In other words, the silicon nitride film 317 is formed on the gate electrode 13 with the silicide layer 16 interposed between them. On the outer side wall of the gate electrode 13, the silicon nitride film 317 is formed with the spacer layer 99 interposed between them. On the diffusion layer 14 not shared, the silicon nitride film 317 is formed with a silicide layer 16 interposed between them. On the device isolation region 11, the silicon nitride film 317 is formed.

A contact hole 20 formed through the interlayer insulating film 19 is provided for the common diffusion layer 14 between the two gate electrodes. No problem is posed even though the center of the contact hole 20 is slightly shifted from the center of the common diffusion layer 14 owing to the self-alignment technique.

A contact electrode 21 made of metal is buried in the contact hole 20, thereby enabling electrical contact with the common diffusion layer 14. The sheet resistance between the contact electrode 21 and the common diffusion layer 14 is suppressed to 5 Ω by the presence of the silicide layer 16.

Now, a method of manufacturing such a semi-conductor device will be explained.

Figure 6:
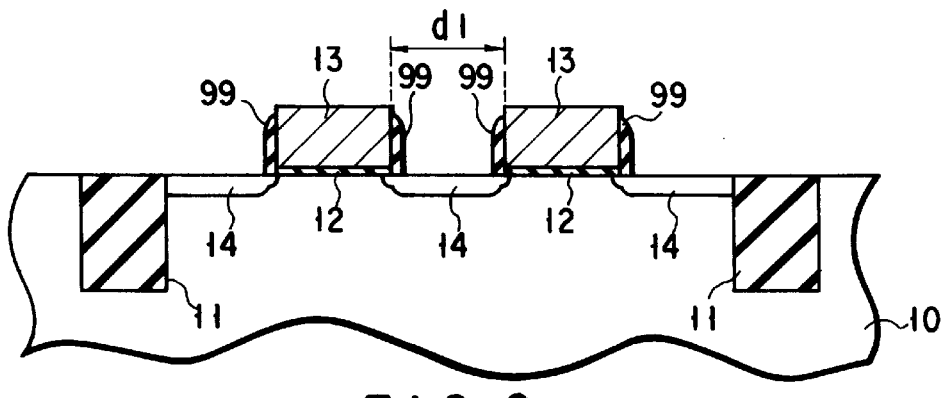
FIG. 6 is a cross sectional view of a semi-conductor device formed in a first step of manufacturing the semiconductor device shown in FIG. 5.

As shown in FIG. 6, the device isolation region 11 is first formed in the silicon substrate 10 by a trench device isolation method or a selective oxidation method. Second, the gate electrode 13 is pattern-formed on the portion surrounded by the device isolation region 11 with the gate insulating film 12 interposed between them.

The gate electrode 13 is formed of a single-layer polysilicon doped with N- or P-type impurities in a thickness of 100 nm to 400 nm. Such a gate electrode 13 may be formed of two-layered polysilicon, one- or two-layered amorphous silicon. Alternatively, the gate electrode 13 may be a multiple-layer structure of polysilicon and amorphous silicon. The gate insulating film 12 is a silicon oxide film of 4 to 10 nm thick. Note that the interval d1 between two gate electrodes 13 is set at a relatively small value, e.g., 0.25 μm or less, without taking the clearance into consideration.

Subsequently, N-type or P-type impurity ions are implanted into the substrate 10 with the gate electrode 13 used as a mask (first implantation). The silicon nitride film is then deposited over the entire surface. The deposited silicon nitride film is etched back by RIE (reactive ion etching). As a result, the silicon nitride film is left only on the side walls of the gate electrodes 13. The silicon nitride film thus left corresponds to the spacer layer 99.

Thereafter, N-type or P-type impurity ions are implanted into the substrate 10 with the gate electrode 13 and the spacer layer 99 used as a mask (second implantation). As a result, the source/drain diffusion layer 14 is formed. There are various possible ways other than the aforementioned method to form the diffusion layer 14. For example, the ion implantation step may be carried out by use of another mask.

Figure 7:
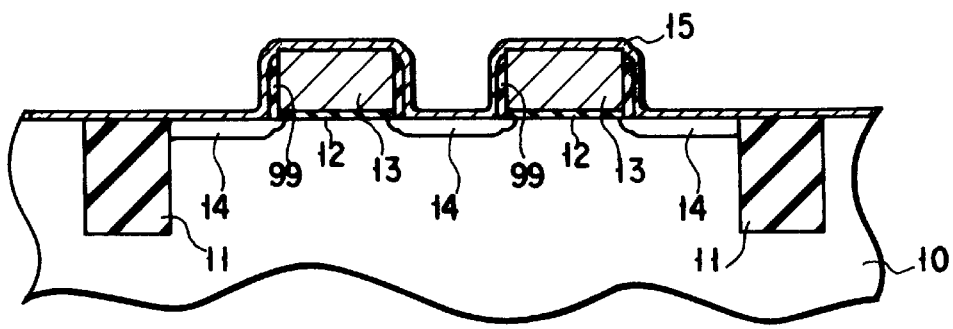
FIG. 7 is a cross sectional view of a semi-conductor device formed in a second step of manufacturing the semiconductor device shown in FIG. 5.

As a next step, as shown in FIG. 7, metal 15 such as Ti, Co, Ni, or Mo is deposited over the entire surface in a thickness of 10 nm to 50 nm by PVD (physical vapor deposition) or CVD (chemical vapor deposition).

Figure 8:
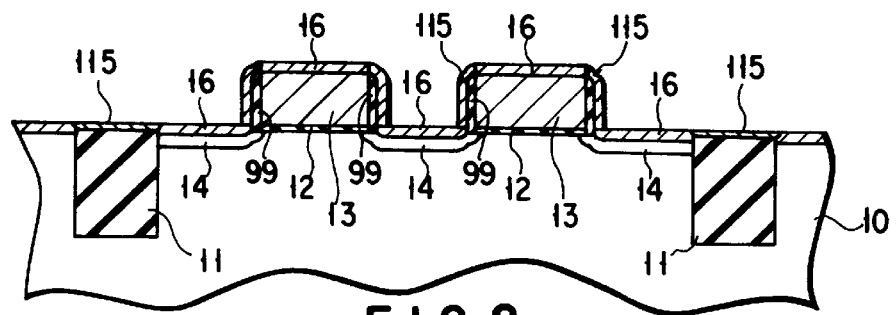
FIG. 8 is a cross sectional view of a semi-conductor device formed in a third step of manufacturing the semiconductor device shown in FIG. 5.

The metal 15 is then heated at a temperature of 600 to 800° C. to allow it to react with silicon. As a result, a silicide layer 16 is formed, in a self-alignment manner, on only the surface layer portions of the gate electrode 13 and the diffusion layer 14, as shown in FIG. 8. In this case, the metal 115 not in contact with silicon and deposited on the spacer layer 99 and the device isolation region 11 remains as it is without being converted into a silicide. In this way, the side walls of the gate electrode 13 are prevented from being converted into a silicide owing to the presence of the spacer layer 99.

Figure 9:
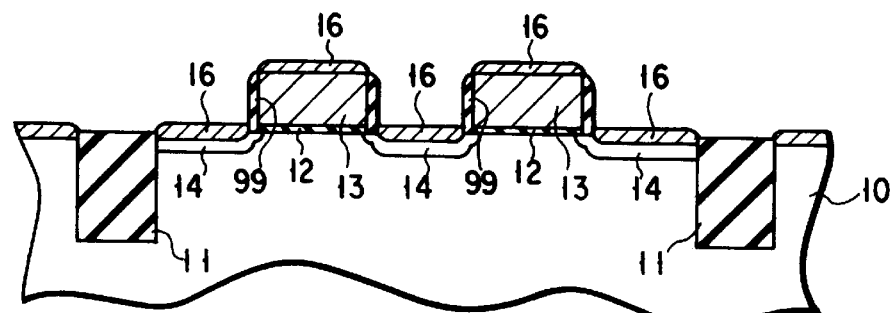
FIG. 9 is a cross sectional view of a semi-conductor device formed in a fourth step of manufacturing the semiconductor device shown in FIG. 5.

The remaining metal 115 is etched with a solution mixture containing, for example, sulfuric acid and hydrogen peroxide in a ratio of 1:1, as shown in FIG. 9. In the meantime, ions are implanted into the source/drain diffusion layer 14 via the silicide layer 16.

Figure 10:
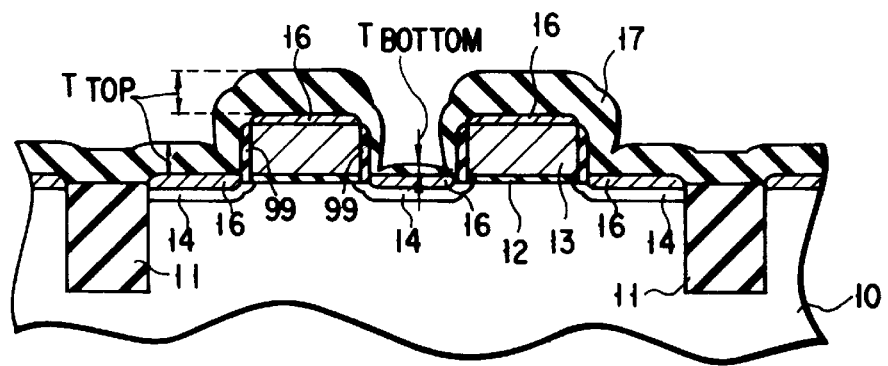
FIG. 10 is a cross sectional view of a semi-conductor device formed in a fifth step of manufacturing the semiconductor device shown in FIG. 5.

Thereafter, as shown in FIG. 10, for example, a silicon nitride film 17 is deposited over the entire surface by a plasma CVD method to form a protection film. At this time, the silicon nitride film 17 is deposited on the narrow portion, namely, the common diffusion layer 14, sandwiched between adjacent two gate electrodes 13. However, since the interval d1 between the gate electrodes 13 is as narrow as at most about 400 nm, the thickness (Tbottom) of the silicon nitride film 17 deposited on the common diffusion layer 14 is inevitably and inherently thinner than the thickness (Ttop) of the silicon nitride film 17 deposited on other portions including the open gate electrode 13, the outer diffusion layer 14, and the device isolation region 11. The ratio in thickness (Tbottom/Ttop (<1)) is controllable by regulating the pressure during the plasma CVD.

Figure 11:
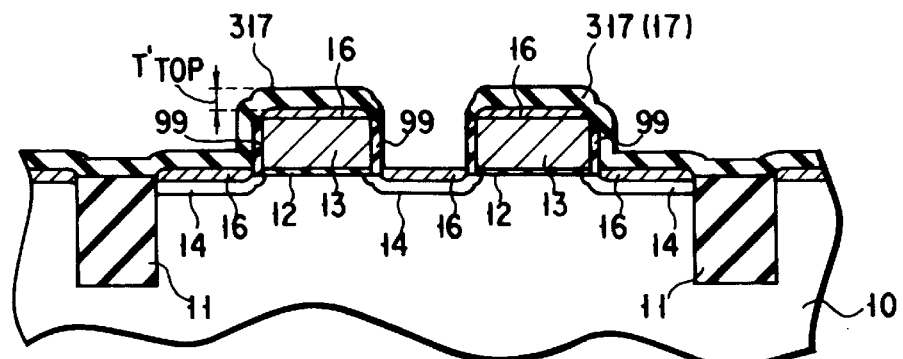
FIG. 11 is a cross sectional view of the semi-conductor device formed in the sixth step of manufacturing the semi-conductor device shown in FIG. 5.

Subsequently, as shown in FIG. 11, the silicon nitride film 17 is etched back by CDE (chemical dry etching) or RIE. The etching time for attaining complete removal of the silicon nitride film 17 from the common diffusion layer 14 is controlled as short as possible. For example, the etching time is given by calculating etching time required for removing the silicon nitride film from the common diffusion layer 14 and adding extra time (20% of the calculated time) for ensuring the "complete removal" to the previously calculated etching time.

After completion of the etching, the silicon nitride film 17 is completely removed from the common diffusion layer 14, whereas the silicon nitride film 17 remains in a thickness of T'top on the gate electrode 13, the outer diffusion layer 14, and the device isolation region 11. This is because Tbottom<Ttop. Needles to say, Ttop>T'top.

It is preferable that the silicon nitride film 17 be etched with a gas having a high selectivity to the silicon nitride film 17 enough to ignore the etching amount of the silicide layer 16.

Figure 12:
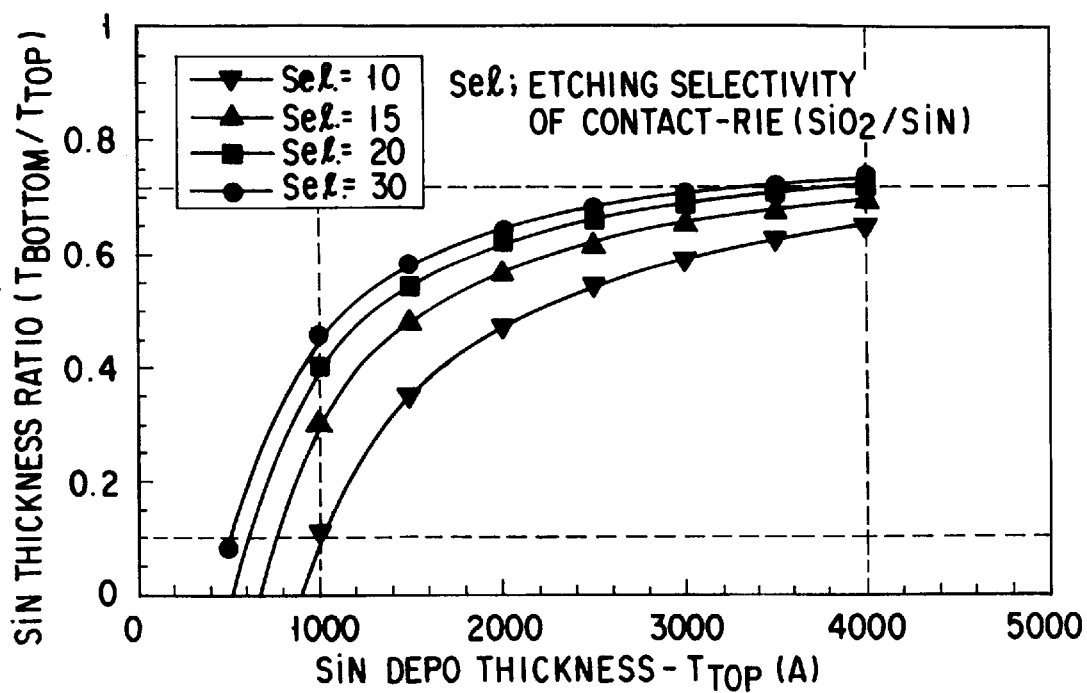
FIG. 12 is a graph showing the relationship between the thickness of the silicon nitride film deposited on the gate electrode and a ratio in thickness of the silicon nitride film deposited on the diffusion layer to that deposited on the gate electrode.

In the etching step, it is preferable that the ratio of Tbottom (thickness of the silicon nitride film deposited on the common diffusion layer 14) to Ttop (thickness of the silicon nitride film 17 deposited on the gate electrode 13) be not excessively large in order to leave the silicon nitride film 17 on the gate electrode 13 and other portions after the silicon nitride film 17 is removed from the common diffusion layer 17 during the etching step. Furthermore, in order to maintain the silicon nitride film 17 on the gate electrode 13 and other portions in a thickness necessary for insulation, for example, about 200A, after the RIE step described later, Ttop (thickness of the silicon nitride film 17 deposited on the gate electrode 13 and other portions) should not be too thin. To satisfy both conditions, the ratio of Tbottom:Ttop is preferably to fall within the range of 1:10 to 1:1.4, as shown in FIG. 12. In this case, Ttop (the thickness of the silicon nitride film 17 on the gate electrode 13) falls within the range of 100 nm to 400 nm.

Figure 13:
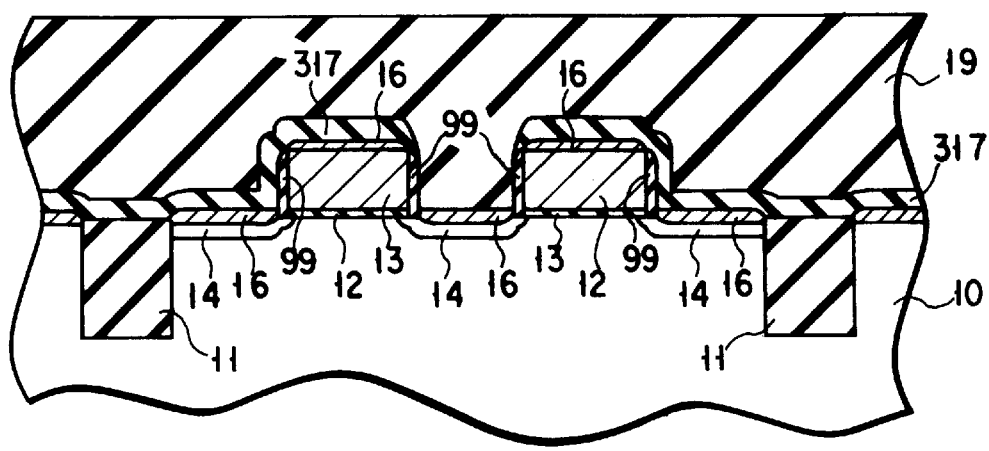
FIG. 13 is a cross sectional view of the semiconductor device formed in the seventh step of manufacturing the semiconductor device shown in FIG. 5.

Thereafter, as shown in FIG. 13, the interlayer insulating film 19 is deposited over the entire surface by a CVD method. The interlayer surface 19 is constituted of $SiO_2$ or BPSG (borophosphosilicate glass), or in combination thereof.

Figure 14:
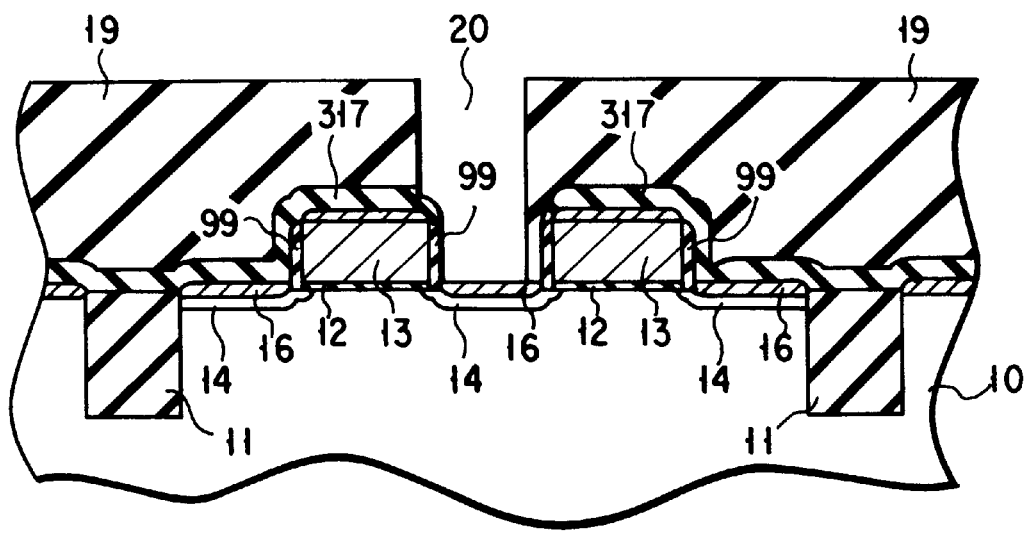
FIG. 14 is a cross sectional view of the semiconductor device formed in the eighth step of manufacturing the semiconductor device shown in FIG. 5.

Next, as shown in FIG. 14, a contact hole 20 for common diffusion layer 14 between the gate electrodes 13 is formed in the interlayer insulating film 19 by a photolithographic method. The width of the contact hole 20 is set at a size equal to or larger than the width of the common diffusion layer 14 between the gate electrodes 13. The contact hole 20 is formed by the self-aligning technique without providing the aligning clearance.

The contact hole 20 is formed by RIE under the conditions in which the etching rate of the silicon nitride films 317 and 99 formed on the gate electrode 13 and on the side wall is significantly lower than that of the interlayer insulating film 19 ($SiO_2$). Since silicon nitride films 317 and 99 are left by the aforementioned RIE, the insulating state between the gate electrode 13 and the metal contact electrode buried in the contact hole 20 can be maintained, even if the position of the resist for forming the contact hole 20 is slightly shifted during the photolithography.

As the contact electrode, various wiring members or plug electrode members including Al, an Al/Cu alloy, and Cu, may be possibly used. For example, after the plug electrode is buried in the contact hole 20, the conducting layer to be connected to the plug electrode may be formed.

As described above, this embodiment takes an advantage of the fact that the deposition efficiency of a narrow interval between the electrodes is lower than that of the open space. By virtue of this, if the coating (silicon nitride film) is removed from the common diffusion layer, the silicon nitride film on the gate electrode still remains. In other words, the step of removing the coating on the common diffusion layer may be performed simultaneously with the step of forming a cap layer on the gate electrode. Such a constitution is advantageous for forming a small contact electrode in a narrow interval between gate electrodes without a contact clearance. In addition, even if a salicide structure is employed, such a contact electrode can be achieved without any problem in the manufacturing steps. That is, the contact electrode is formed without increasing the manufacturing steps and at a low cost. When the other contact portions are required, they may be formed by removing the silicon nitride film appropriately from an open hole to thereby allow an electric contact. The protecting film used in the present invention is not limited to a silicon nitride film. Any material may be used as long as it satisfies a desired selective ratio required in the each step and it can be deposited to form the protection film with a low coverage to some extent.

Figure 15:
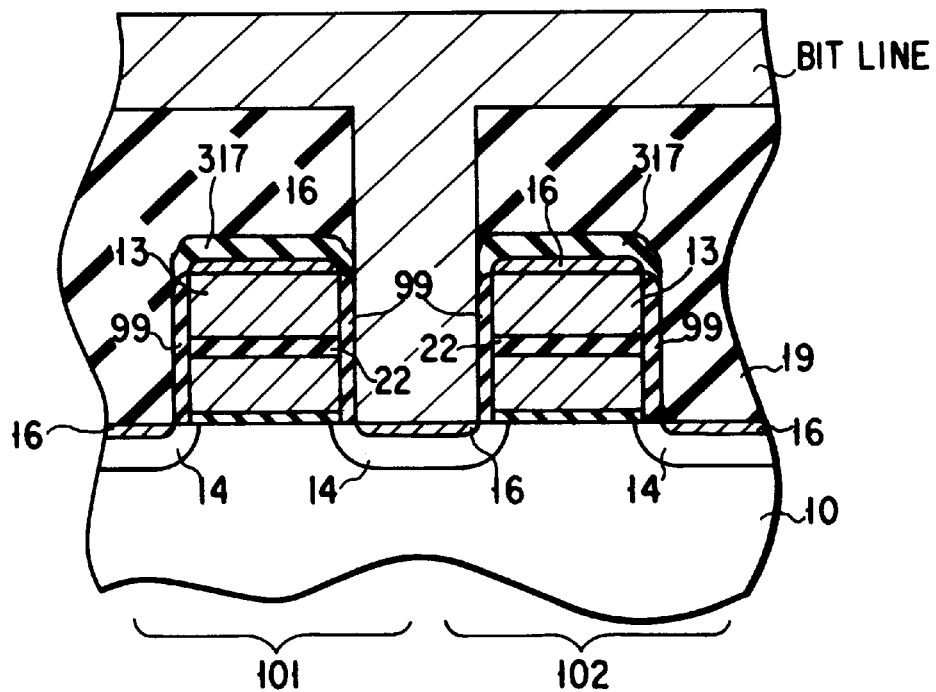
FIG. 15 is a cross sectional view of a memory cell formed by the salicide technique and the self-alignment contact technique, according to an applied embodiment of the present invention.

The present invention may be applied to the semiconductor memory, more specifically, to a contact inside the memory cell array in which the memory cells are aligned at narrow intervals(pitches), such as a bit line contact provided between selective gate transistors of an Nor type memory cell and an NAND type memory cell (see FIG. 15). The insulating-gate type transistors 101 and 102 having a two-layered gate structure represent memory cells in the case of the NOR-type memory and selective gate transistors in the case of the NAND-type memory. The gate insulating film 22 between two layers may include a nitride film in the case of the memory cell.

Also in the structure shown in FIG. 15, a metal silicide layer 16 is formed on the upper surface of the upper gate electrode 13 and on the surface of the source/drain diffusion layer 14, in the same manner as in the aforementioned embodiment. A spacer 99 formed of, for example, a silicon nitride film is formed on the side surfaces of the gate electrode. The upper portion of the gate electrode is covered with the silicon nitride film 317.

If the present invention is applied to memory device such as the memory cells of flush EEFPROMs, DRAMs, and SRAMs, or the peripheral circuits; or a gate array, the high integration of a device and the high operation speed are attained at the same time.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

I claim:

1. A method of manufacturing a semiconductor device, comprising the steps of:

forming two electrodes on a substrate, said two electrodes being positioned side by side at a predetermined interval;

forming a spacer layer on each of side walls of said two electrodes;

forming three diffusion layers in a surface layer of said substrate, each of said two electrodes being interposed between adjacent diffusion layers in such a way that a diffusion layer formed between said two electrodes is shared with the two electrodes;

forming a silicide layer on each of said two electrodes and said three diffusion layers in a self alignment manner, depositing an insulating film over an entire surface, said insulating film deposited on said diffusion layer commonly shared which is present in a depressed space between said two electrodes via the silicide layer being thinner than the insulating film deposited on an open space on said two electrodes via the silicide layer;

etching said insulating film, at least one factor of time and pressure during the etching being controlled in such a way that an insulating film deposited on said diffusion layer commonly shared via said silicide layer is removed substantially completely whereas the insulating film deposited on said two electrodes via said silicide layer is not removed completely and left as a thin film;

depositing an interlayer insulating film over an entire surface;

etching said interlayer insulating film for forming a contact hole for said diffusion layer commonly shared; and burring a conducting member in said contact hole, said conducting member buried being electrically connected to said diffusion layer commonly shared via the silicide layer and insulated from said two electrodes by said remaining insulating film.

2. The method according to claim 1, wherein, in said step of depositing the insulating film over an entire surface, a ratio in thickness of the insulating film formed on said diffusion layer commonly shared to the insulating film formed on said two electrodes falls within the range of 1:10 to 1:1.4.

3. The method according to claim 1, wherein, in the step of depositing said insulating film over an entire surface, said insulating film is deposited on said two electrodes in a thickness within a range of 100 nm to 400 nm.

4. The method according to claim 1, wherein, in the step of etching said insulating film, the etching is performed for a period of time adjusted to about 120% of calculated etching time which is required for removing the insulating film deposited on said diffusion layer commonly shared via said silicide layer.

5. The method according to claim 1, wherein, in the step of depositing said insulating film over an entire surface, said insulating film is a silicon nitride film formed by a plasma CVD method.

6. The method according to claim 1, wherein, said spacer layer is formed substantially the same material as that of said insulating film.

7. The method according to claim 6, wherein said insulating film is a silicon nitride film.

8. The method according to claim 1, wherein, in the step of forming said contact hole, said spacer layer and said remaining insulating film serve as an etching stopper.

9. The method according to claim 1, wherein said diffusion layer commonly shared is narrower in width than that of said contact hole.

10. The method according to claim 1, wherein said two electrodes are made of polysilicon.

11. The method according to claim 1, wherein said two electrodes correspond to gate electrodes of a transistor in a memory cell array.

12. The method according to claim 1, wherein an interval between said two electrodes is 0.25 µm or less.

* * * * *